(12) United States Patent
Mueller et al.

(10) Patent No.: US 12,422,756 B2
(45) Date of Patent: Sep. 23, 2025

(54) OPTICAL SYSTEM, IN PARTICULAR LITHOGRAPHY SYSTEM

(71) Applicant: Carl Zeiss SMT GmbH, Oberkochen (DE)

(72) Inventors: Tanja Mueller, Heidenheim (DE);
Rudi Littelink, Bathmen (NL);
Johannes Bauer, Giengen an der Brenz (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 316 days.

(21) Appl. No.: 18/173,461

(22) Filed: Feb. 23, 2023

(65) Prior Publication Data
US 2023/0194994 A1  Jun. 22, 2023

Related U.S. Application Data

(63) Continuation of application No. PCT/EP2021/075106, filed on Sep. 13, 2021.

(30) Foreign Application Priority Data

Sep. 17, 2020 (DE) .......................... 102020211663.6

(51) Int. Cl.
*G03F 7/00* (2006.01)
*G02B 7/00* (2021.01)

(52) U.S. Cl.
CPC .......... *G03F 7/70233* (2013.01); *G02B 7/00* (2013.01)

(58) Field of Classification Search
CPC ... G03F 7/70233; G03F 7/70825; G02B 7/00; G02B 7/006
See application file for complete search history.

(56) References Cited

U.S. PATENT DOCUMENTS

| 2,638,815 A | 5/1953 | Croy | |
| 7,236,230 B2 * | 6/2007 | Miyajima | G03F 7/70833 355/53 |
| 9,604,299 B2 * | 3/2017 | Schoeppach | B23K 1/0008 |

(Continued)

FOREIGN PATENT DOCUMENTS

| CN | 109844633 A | 6/2019 |
| DE | 102015201253 A1 | 3/2015 |
| DE | 102015215948 A1 | 10/2015 |

(Continued)

OTHER PUBLICATIONS

International Search Report and Written Opinion for corresponding PCT Appl No. PCT/EP2021/075106, dated Dec. 21, 2021.

(Continued)

*Primary Examiner* — Hung V Nguyen
(74) *Attorney, Agent, or Firm* — Fish & Richardson P.C.

(57) ABSTRACT

An optical system, such as a lithography system, comprises: a plate-shaped component, such as a stop element; an optionally frame-shaped holder for holding the component; and a plurality of webs for connecting the plate-shaped component to the holder. The plate-shaped component is releasably connected to the preferably wire-shaped webs. The plate-shaped component is attached to a carrying structure. The webs are releasably connected to the carrying structure.

19 Claims, 7 Drawing Sheets

(56) References Cited

U.S. PATENT DOCUMENTS

2015/0008215 A1    1/2015  Schoeppach

FOREIGN PATENT DOCUMENTS

| | | |
|---|---|---|
| DE | 102016219332 A1 | 12/2016 |
| DE | 102015220144 A1 | 4/2017 |
| DE | 102016221823 A1 | 9/2017 |
| DE | 102017219266 A1 | 5/2018 |
| DE | 102019205959 A1 | 6/2019 |
| DE | 102019209883 A1 | 8/2019 |
| DE | 102020208007 A1 | 12/2021 |
| TW | 202022502 A | 6/2020 |
| WO | WO2006/069725 A1 | 7/2006 |
| WO | WO2017/029383 A1 | 2/2017 |
| WO | WO2022/002533 A1 | 1/2020 |

OTHER PUBLICATIONS

German Office Action, with translation thereof, for corresponding DE Appl 10 2020 211 663.6, dated Mar. 25, 2021.
Office Action in Taiwanese Appln. No. 110134324, mailed on Apr. 30, 2025, 9 pages (with English summary).

\* cited by examiner

OPTICAL SYSTEM, IN PARTICULAR LITHOGRAPHY SYSTEM

CROSS-REFERENCE TO RELATED APPLICATIONS

The present application is a continuation of, and claims benefit under 35 USC 120 to, international application PCT/EP2021/075106, filed Sep. 13, 2021, which claims benefit under 35 USC 119 of German Application No. 10 2020 211 663.6, filed Sep. 17, 2020. The entire disclosure of these applications are incorporated by reference herein.

FIELD

The disclosure relates to an optical system, for example to a lithography system, comprising: an optionally plate-shaped component, for example a stop element; an optionally frame-shaped holder; and a plurality of webs for connecting the component to the holder.

The lithography system can be a lithography apparatus for exposing a wafer or another microlithographic optical system, for example an inspection system, for example a system for measuring or inspecting masks, wafers or the like, which are used in lithography. The lithography system can be, for example, an EUV lithography apparatus or a DUV lithography apparatus. EUV stands for "extreme ultraviolet" and denotes a wavelength of the used radiation of between 0.1 nm and 30 nm. DUV stands for "deep ultraviolet" and denotes a wavelength of the used radiation of between 30 nm and 250 nm.

The component that is held by the webs or by the holder can be, for example, a manipulator element, for example an actuator, or a stop element. Stop elements are used for different purposes in optical systems, for example in lithography systems, and are referred to, for example, as aperture stop, obscuration stop, field stop, stray-light stop, extraneous-light stop, etc., depending on their function in the optical system.

An aperture stop often has the task of trimming working light in a radial direction with reference to a beam path from the outside to the inside. An obscuration stop often has the task of covering an obscuration in the beam path. To this end, the obscuration stop can cut out a—with reference to the beam path in the radial direction—inner part of the working light. Extraneous-light stops or stray-light stops are frequently positioned in intermediate images or in intermediate image planes. Field stops are positioned in field planes.

An obscuration stop is typically held in the beam path by holder elements, for example by webs, in order to connect the obscuration stop to a holder outside the beam path. Each of these holder elements can shade the beam path in a part of the working light (used light) that contributes to the imaging. The holder elements are therefore typically very thin and can be designed for example in the form of thin wires, in the form of threads, in the form of springs or in the form of blades.

BACKGROUND

DE 10 2015 201 253 A1 describes a projection exposure apparatus having an obscuration stop that has an outer stop ring and an inner stop, located inside the stop ring, for blocking out an inner region of a working light beam. The inner stop can be connected via webs to the outer stop ring and is held by the webs. The webs can be used as heat-conducting elements for dissipating heat from the inner stop.

DE 10 2017 219 266 A1 describes an optical system having an obscuration stop and having a holder holding the obscuration stop in the beam path. The optical system can have a decoupling device for decoupling the thermal expansion from the obscuration stop to the holder. The decoupling device can comprise a spring, for example a leaf spring, arranged between one of the webs and the holder. The obscuration stop can have a stop element and a plurality of webs that are connected on one side to the stop element and on the other side to the holder. The spring can be arranged between one of the webs and the holder. The webs can be formed in one piece with the stop element.

The thin holder elements can be limited in their ability to provide sufficient stiffness against torques, which can mean that in some instances the obscuration stop is stabilized only with difficulty against tilting. DE 10 2019 205 959 A1 therefore proposes to shape a peripheral region of the stop at which the light-determining edge thereof is provided such that, if the stop tilts about a tilt axis, a cross-sectional surface that is shaded by the stop remains constant.

DE 10 2019 209 883 A1 proposes the use of a retaining device for an obscuration stop in a pupil plane. The retaining device comprises attachment elements, arranged outside the pupil plane, for attaching the retaining device to a fixed world of the optical system. The attachment elements can be designed to be wire-shaped or blade-shaped and a tensile force can be applied thereto in order to brace the retaining device with the fixed world.

SUMMARY

The disclosure seeks to provide an optical system with an improved holder of a component, for example of a stop element.

The disclosure provides an optical system in which the component is releasably connected to the optionally wire-shaped webs.

In contrast to DE 10 2017 219 266 A1, which proposes that the stop element and the webs be formed in one piece, or in contrast to an integral connection in which the component is connected to the webs for example by welding, the component, for example in the form of a stop element, in the optical system according to the disclosure is releasably connected to the webs. The releasable connection may be, for example, a clamping connection or a plug connection. Releasably connecting the component to the webs can simplify the adjustment of the component. This can be beneficial for example in the case of a component in the form of a stop element, the light-determining edge of which is desirably positioned precisely with respect to the beam path. The releasable connection additionally can make it possible to interchange the component in a simple manner.

The webs may be designed, for example, in a wire-shaped manner (in the form of wires). This can be beneficial for example if a pretension is intended to be applied to the webs (see below). However, it is also possible in principle to design the webs for example in the form of thin blades, in the form of threads or in the form of springs. The webs typically extend in a straight line.

In one embodiment, at least one web spans an opening in the frame-shaped holder. In this embodiment, at least one web, for example all webs, can extend along the frame-shaped holder starting from a first position to a second position on an opposite side of the frame-shaped holder. A respective web spanning the opening thus starts from a first position of the frame-shaped holder, however it does not terminate at the component but rather extends further therefrom up to the second position at the frame-shaped holder.

The geometry of the opening in the frame-shaped holder can be designed in various ways, for example to be round, oval or rectangular. A respective web can extend from a first side of the opening to an opposite side of the opening and, for example, perpendicular to a further web that likewise spans the opening. However, it is also possible that a web or a plurality of webs extend along the diagonal of a for example rectangular or circular opening in the holder.

In an embodiment, the optical system comprises at least one optionally pretensioned spring, for example in the form of a leaf spring, arranged between one of the webs and the holder. The spring makes it possible to apply pretension to a respective web. For details relating to the use of springs for tensioning the for example wire-shaped webs, reference is made to DE 10 2017 219 266 A1 mentioned in the introductory part, the entirety of which is incorporated into the content of this application by reference. A web that spans the opening can be pretensioned at its opposite ends with the aid of a spring in each case.

In one embodiment, the optical system comprises at least one length-setting device for setting the length of at least one of the webs. The length-setting device can be mounted on the pretensioned spring (and is deflected together with the spring). The length-setting device can have for example a winding element, for example in the manner of a cylindrical coil or the like, onto which the (wire-shaped) web is wound along a section of its length. The length of the web (outside of the winding element) can be set by rotating the winding element about its longitudinal axis. The length-setting device can also have an (at least one) fixing element, for example a clamping element or the like, for fixing the winding element in its angular position relative to the longitudinal axis. When the web has its desirable length, the winding element is fixed in its angular position with the aid of the fixing element, for example by the winding element being clamped in place so that it can no longer be rotated about its axis of rotation.

The mounting of the length-setting device on the pretensioned spring, for example a leaf spring, makes it possible to keep the web pretensioned even if the length thereof inadvertently increases. The undesired increase in length can occur for example due to material yield when the yield limit is exceeded or due to an increase in the temperature of the web. When mounting the length-setting device on the pretensioned spring, the length-setting device and thus also the web connected thereto are deflected, with the result that the pretensioning of the web can be maintained even in this case.

In one embodiment, the plate-shaped component, typically in the form of a stop element, is attached to a carrying structure that optionally does not project laterally beyond the plate-shaped component, and the webs are releasably connected to the carrying structure. The plate-shaped component can be attached to the carrying structure using a releasable connection or using a permanent connection. The carrying structure in this case can form an adapter in order to connect the in this case generally very thin plate-shaped component to the webs. The carrying structure can be used to suspend the plate-shaped component or to support the plate-shaped component.

The plate-shaped component in this embodiment typically has a very low thickness of less than approximately 500 µm, for example in the order of 200 µm to 300 µm. The plate-shaped component can be, for example, a thin quartz glass plate produced for example by chemical etching or another, very thin metal sheet (e.g. made from invar). If the component is a stop element, the quartz glass plate typically has a reflective coating. The component can be integrally connected to the carrying structure, but it is also possible to connect the component to the carrying structure via a form-fitting and/or force-fitting connection.

The material of the carrying structure can be for example invar, which has a low coefficient of thermal expansion, or another suitable material that is releasably connected to the for example wire-shaped webs. The releasable connection of the carrying structure with the webs can be realized, for example, by a (possibly complete) clamping of the wires in indent-shaped depressions of the carrying structure. However, the wires can also be guided through openings or holes in a for example frame-shaped section of the carrying structure. In the case of a suitable arrangement or alignment of the holes, the component can in this case also be arranged or held at a specified position in the optical system.

In a further embodiment, the plate-shaped component has at least one optionally rod-shaped retaining element (pin), which comprises a retaining section for the releasable connection to one of the webs. The retaining element typically projects over the plate-shaped component perpendicularly to the latter. However, it goes without saying that the retaining element does not necessarily have to be aligned perpendicularly to the plate-shaped component. The retaining element can be formed in one piece with the component, but the retaining element can also be pressed together with the component or connected thereto in another way. The retaining element or the retaining section can be used for substantially punctiformly connecting the component to a respective web. There are various possibilities for connecting the retaining section to the web.

In one development of this embodiment, the retaining section forms at least one optionally angled notch for the clamping connection to the web. In this case, the web can be clamped into the notch. The notch can be designed (angled) such that the for example wire-shaped web and the component block themselves. In this embodiment, typically in each case two retaining elements of the component can be used for the releasable connection to a web. These two retaining elements can be arranged diametrically opposite one another in each case near a lateral edge of the component. Different types of retaining elements may be provided for holding the component at two or more webs to ensure that the component and the wire-shaped webs block themselves.

In a further development, the retaining section forms at least one notch for being wrapped with the wire-shaped web. In this development, the—in this case wire-shaped—web is wound around the notch in the retaining section of the retaining element. In order to hold the component at a desired position and alignment and in order to block its orientation, the wire-shaped web can be wound around a further notch of a further retaining element.

In a further embodiment, the component has at least one depression or at least one hole through which the web is guided. This embodiment can be combined for example with the embodiment described further above, in which the wire-shaped web is wound around the notch. One and the same web can in this case be wound around the notch in the retaining element and be guided through the hole or the depression so as to fix the orientation of the component. To fix the orientation of the component, it can be desirable for the distance between the wrapped retaining element and the hole or depression in the component is as large as possible. This can be ensured for example by the retaining element and the hole/depression being arranged at diametrically opposite edges of the component.

In one further embodiment, the hole is closed by a seal that surrounds the web and fixes the latter in the hole. In this case, the hole can have a larger diameter than the for example wire-shaped web that is guided through the hole. To fix the location or the orientation of the wire-shaped web relative to the hole, the wire-shaped web can be embedded in a seal. A further hole at an opposite periphery of the component can in this case be used for guiding the wire-shaped web through without fixing it relative to the component, but it is also possible to fasten a further seal there. The seal can consist of the same material as the wire-shaped web, for example of tungsten or rhenium.

In a further development of this embodiment, two holes are formed in the element, through which the wire-shaped web is guided and between which the wire-shaped web is wound around the component, for example around a section of the component that is formed between the two holes, in the manner of a loop. In this way it is also possible to ensure a releasable connection between the component and the wire-shaped web, which can make it possible to hold the component in a desired alignment and position. In this case, the holes are typically through-holes extending in a direction perpendicular to the plane of the component.

In a further embodiment, the depression or the hole has at least one curved section for bending the wire-shaped web as it is guided in the depression or in the hole and to fix or hold the web to or at the component in this way. The wire-shaped web in this case can be held in the depression or in the hole or is fixed there by way of bracing and friction. Fixing is understood to mean that the component cannot be easily displaced along the wire-shaped web due to the bracing and/or friction. This embodiment can be desirable for example if the wire-shaped web, as was described further above, is pretensioned by a spring because this promotes the fixing of the component to the wire-shaped web by bending. The depression can have a lid, that is to say be formed in the manner of a hole having a curved section. In this case it is also possible for the component to be held in place due to friction.

In order to bend the wire-shaped web, the depression or the hole is not formed in a straight line but has at least one curved section between a first, entry-side end and a second, exit-side end of the web. It is not absolutely necessary that the depression or the hole has a width that substantially corresponds to the width of the wire-shaped web. Rather, the depression or the hole can have a significantly larger width than the wire-shaped web. In this case, the wire-shaped web can also be bent in the depression or in the hole. For example, this can be accomplished by the wire-shaped web being guided along a first side wall of the depression or the hole before the curved section of the depression or the hole and by being guided after the curved section along a second side wall of the depression or the hole, which is laterally offset with respect to the first side wall.

In a development of this embodiment, the curved section has an S-shaped geometry. In this case, the wire-shaped web can enter at an entry-side end of the depression or the hole and can emerge from an exit-side end of the depression or the hole with a parallel offset that arises due to the S-shaped section of the depression or the hole. Such guidance of the wire-shaped web has proven beneficial for example for the case of the pretensioning of the wire-shaped webs (e.g. with the aid of leaf springs) because, in this case, too great a deflection of the wire-shaped web at the stop element is rather unfavourable.

In a further embodiment, the stop element forms an obscuration stop for blocking out an inner partial region of a beam path of the optical system. As was described further above, the obscuration stop is, in general, designed to block out or shade an inner partial region of the cross-sectional area of the beam path. The obscuration stop is typically used to cover an obscuration, for example a perforation in a mirror or the like, through which the beam path of the optical system extends. The obscuration stop, more specifically the outer boundary of the obscuration stop (equivalent to an outer light-determining edge), can be designed to be circular, elliptical, polygonal, for example rectangular or square, or correspond to a free form. Projection systems having an obscured optical design, more specifically having an obscured pupil, are described for example in WO2006/069725 A1, the entirety of which is incorporated into the content of this application by reference.

The holder of the obscuration stop can be a carrying frame of the optical system to which typically the aperture stop is also attached or it can be a component connected to the carrying frame, for example a stop module. However, the aperture stop can also be used as a holder for the obscuration stop, as is described for example in DE 10 2016 221 823 A1, the entirety of which is incorporated into the content of this application by reference.

Rather than the obscuration stop, the component held by the holder can also be another type of stop element, for example an aperture stop, a stray-light stop, a field stop, an extraneous-light stop, etc. A component that is not a stop element, for example an actuator or the like, can also be held with the aid of the webs in the manner described further above. Such a component—including a stop element—can be held at a defined position and with a defined alignment in the beam path of the optical system or relative to the beam path of the optical system. For example, an aperture stop can be aligned in the manner described further above such that an edge of the aperture stop forming the periphery of the aperture of the aperture stop is positioned exactly where the delimitation of the beam path of the optical system at the outer circumference thereof is to be realized.

In a further embodiment, the component is formed from a metallic material that can be selected from the group comprising: aluminium, steel or invar. The optionally plate-shaped component, for example in the form of a stop element, can be formed for example from a metallic material, for example from a metal sheet. The use of metallic materials, for example of aluminium or of copper, which have a high thermal conductivity, has proven good for cooling components such as stop elements. Alternatively, the component can be formed from glass, e.g. from quartz glass, and have a reflective coating.

In a further embodiment, the optical system comprises a projection system for imaging a photomask onto a wafer, wherein the stop element is arranged in the region of a pupil plane of the projection system. In this case, the optical system is designed as a lithography apparatus and has, in addition to the projection system, a beam-shaping and illumination system. The illumination settings of the beam-shaping and illumination system can be changed depending on the structure that is to be imaged on the mask, which has an effect on the radiant power or on the thermal load of the stop element.

Further features of the disclosure will be apparent from the description of exemplary embodiments of the disclosure that follows, with reference to the figures of the drawing that show details to the disclosure, and from the claims. The individual features in one variant of the disclosure may each be implemented alone or in a group in any combination.

BRIEF DESCRIPTION OF THE DRAWINGS

Exemplary embodiments are illustrated in the schematic drawings and are explained in the following description. In the figures.

DETAILED DESCRIPTION

In the following description of the drawings, identical reference signs are used for identical or functionally identical components.

Figure 1A:
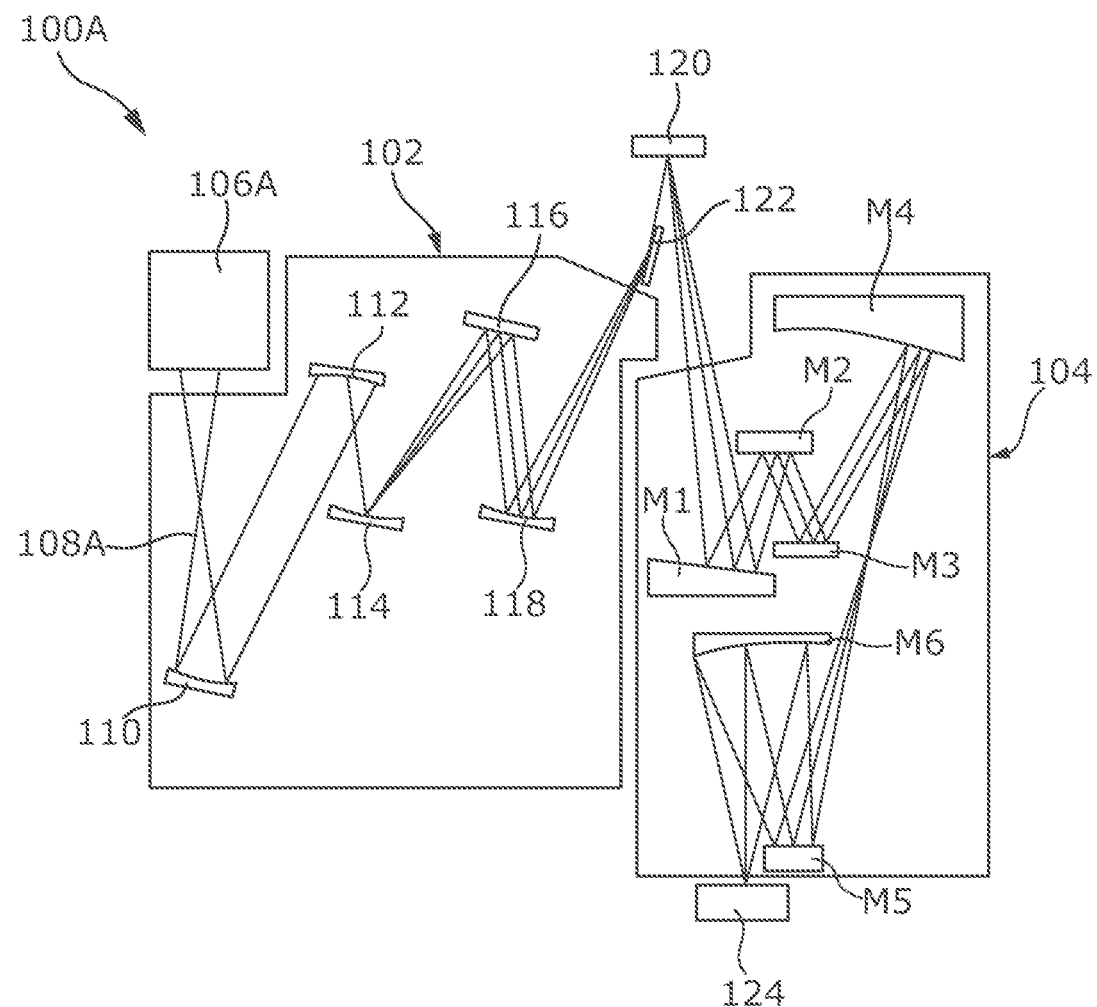
FIG. 1A shows a schematic illustration of an EUV lithography apparatus.

FIG. 1A shows a schematic view of the construction of an EUV lithography apparatus 100A comprising a beam-shaping and illumination system 102 and a projection system 104. The beam-shaping and illumination system 102 and the projection system 104 are each provided in a vacuum housing, indicated in FIG. 1A, wherein each vacuum housing is evacuated with the aid of an evacuation device (not shown). The vacuum housings are surrounded by a machine room (not depicted), in which the drive apparatuses for mechanically moving or setting the optical elements are provided. Moreover, electrical controllers and the like can also be provided in this machine room.

The EUV lithography apparatus 100A has an EUV light source 106A. A plasma source (or a synchrotron), which emits radiation 108A in the EUV range, for example in the wavelength range of between 5 nm and 20 nm, can be provided, for example, as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam-guiding spaces in the beam shaping and illumination system 102 and in the projection system 104 are evacuated.

The beam-shaping and illumination system 102 illustrated in FIG. 1A has five mirrors 110, 112, 114, 116, 118. After passing through the beam-shaping and illumination system 102, the EUV radiation 108A is guided onto the photomask (reticle) 120. The photomask 120 is likewise embodied as a reflective optical element and can be arranged outside the systems 102, 104. Furthermore, the EUV radiation 108A can be directed onto the photomask 120 via a mirror 122. The photomask 120 has a structure which is imaged onto a wafer 124 or the like in a reduced fashion via the projection system 104.

The projection system 104 (also referred to as projection lens) has six mirrors M1-M6 for imaging the photomask 120 onto the wafer 124. It should be noted that the number of mirrors of the EUV lithography apparatus 100A is not restricted to the number illustrated. More or fewer mirrors could also be provided. Furthermore, the mirrors, as a rule, are curved on their front side for beam shaping.

Figure 1B:
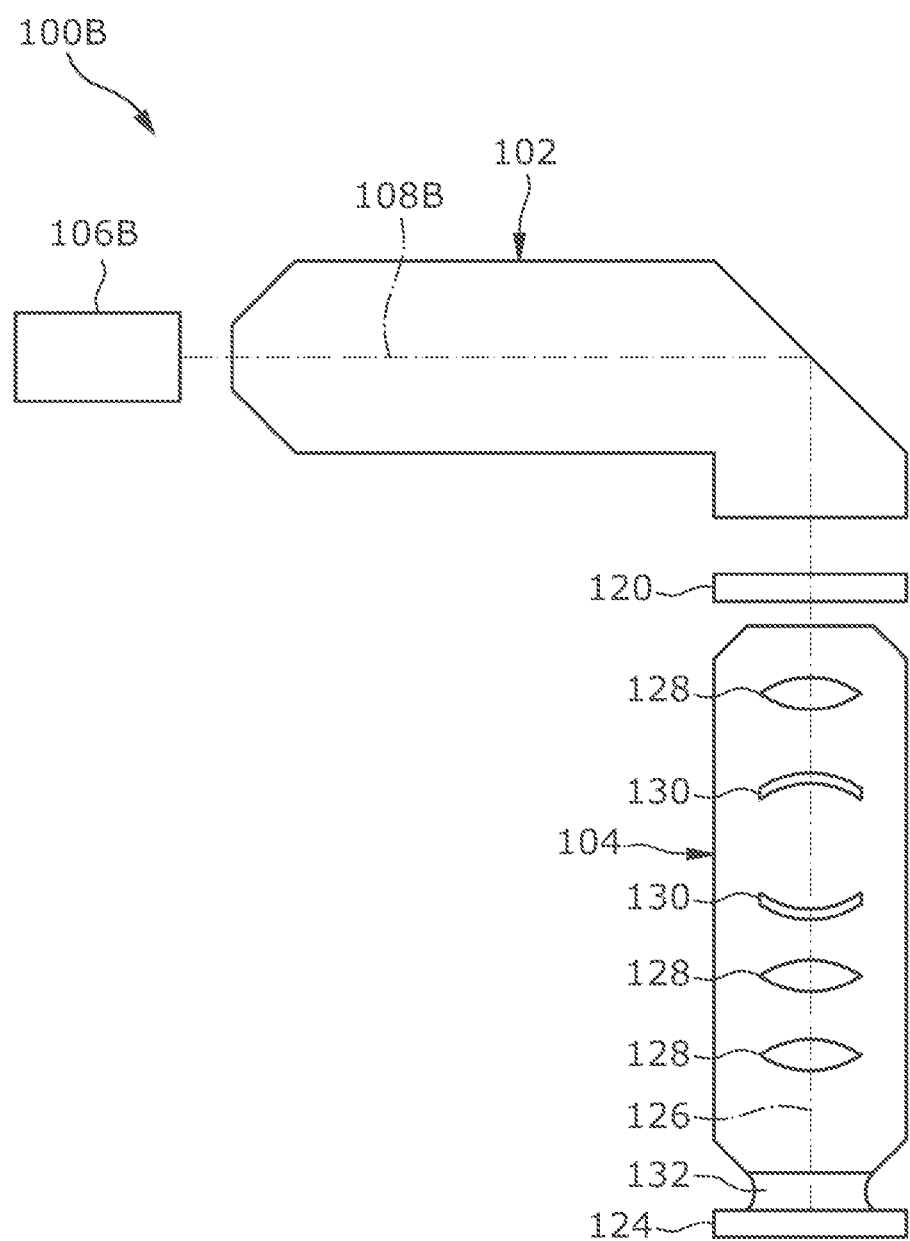
FIG. 1B shows a schematic illustration of a DUV lithography apparatus.

FIG. 1B shows a schematic view of a DUV lithography apparatus 100B, which comprises a beam-shaping and illumination system 102 and a projection system 104. As has already been described with reference to FIG. 1A, the beam-shaping and illumination system 102 and the projection system 104 can be arranged in a vacuum housing and/or be surrounded by a machine room with corresponding drive devices.

The DUV lithography apparatus 100B has a DUV light source 106B. By way of example, an ArF excimer laser that emits radiation 108B in the DUV range at 193 nm, for example, can be provided as the DUV light source 106B.

The beam-shaping and illumination system 102 illustrated in FIG. 1B guides the DUV radiation 108B onto a photomask 120. The photomask 120 is embodied as a transmissive optical element and can be arranged outside the systems 102, 104. The photomask 120 has a structure which is imaged onto a wafer 124 or the like in a reduced fashion via the projection system 104.

The projection system 104 has a plurality of lens elements 128 and/or mirrors 130 for imaging the photomask 120 onto the wafer 124. In this case, individual lens elements 128 and/or mirrors 130 of the projection system 104 can be arranged symmetrically in relation to the optical axis 126 of the projection system 104. It should be noted that the number of lens elements and mirrors of the DUV lithography apparatus 100B is not restricted to the number illustrated. More or fewer lens elements and/or mirrors may also be provided. Furthermore, the mirrors are generally curved on their front side for beam shaping.

An air gap between the last lens element 128 and the wafer 124 may be replaced by a liquid medium 132 which has a refractive index of >1. The liquid medium can be high-purity water, for example. Such a construction is also referred to as immersion lithography and has increased resolution during the imaging of the photomask 120 onto the wafer 124.

Figure 2A:
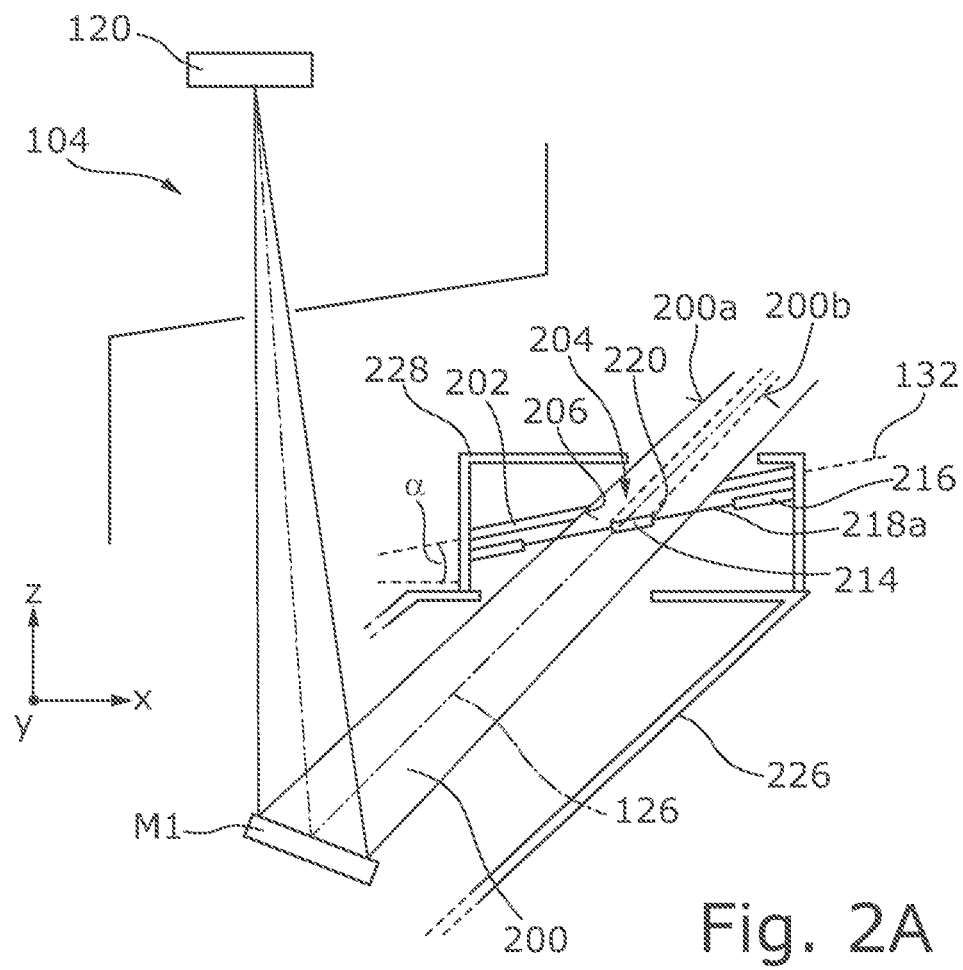
FIGS. 2A-2B show schematic illustrations of an obscuration stop, which is releasably connected to wire-shaped, pretensioned webs that are used to connect the obscuration stop to a holder.

FIG. 2A shows a detail of the EUV lithography apparatus 100A in FIG. 1A, more specifically of the projection system 104. The first mirror M1 illustrated in FIG. 2A and the second mirror M2 (cf. FIG. 1A) define a section of the beam path 200 of the projection system 104 or of the EUV lithography apparatus 100A. Arranged between the first mirror M1 and the second mirror M2 is an aperture stop 202 having an aperture 204 with a circumferential edge 206 for delimiting the beam path 200 of the EUV lithography apparatus 100A at its outer circumference 200a. The aperture stop 202 is used to trim the beam path 200 at the periphery or to define it precisely in order to determine the (entry-side) numerical aperture of the projection system 104.

A portion of the EUV radiation 108A of the EUV lithography apparatus that is incident on a region of the aperture stop 202 adjoining the edge 206 is absorbed by the material of the aperture stop 202, as a result of which the latter heats up. In the example shown in FIG. 2A, the aperture stop 202 is designed to be plate-shaped and consists of a metallic material, that is to say it is a metal sheet. For example, metallic materials having a high coefficient of thermal conduction, e.g. aluminium, copper or steel, have proven useful as materials for the aperture stop 202 (and also for an obscuration stop 214 (see below)) because it permits direct cooling.

In the example shown in FIG. 2A, the aperture stop 202 is arranged in the immediate neighbourhood of a pupil plane 132 of the beam path 200 of the projection system 104. This arrangement is the reason that the aperture stop 202 is arranged inclined at an angle α with respect to a horizontal plane forming the XY plane of an XYZ coordinate system.

The projection system 104 comprises an obscuration (not shown), for example a perforation in one of the mirrors M1 to M6, through which the beam path 200 of the projection system 104 extends. The obscuration is intended to be covered with the aid of an obscuration stop 214, for example in order to reduce a field dependency of a corresponding shading (in the plane of the wafer 124). The obscuration stop 214 is designed to cover or block out an inner partial region 200b of the beam path 200. That is to say part of the EUV radiation 108A is reflected or absorbed by the obscuration stop 214 as it passes along the beam path 200 from the first mirror M1 to the second mirror M2. The obscuration stop 214 is arranged entirely within the beam path 200 in or in the vicinity of the pupil plane 132, more specifically adjacent to the aperture stop 202. The obscuration stop 214 can have a reflective coating (not shown), with the result that any introduction of heat into the obscuration stop 214 is reduced. In the example shown, the obscuration stop 214 is designed as an oval plate and has an outer, circumferential edge 220, which is used as a light-determining edge for the shading of the inner partial region 200b of the beam path 200, as can be easily seen in FIG. 2B. It goes without saying that the obscuration stop 214 does not necessarily have to have an oval design; rather, the outer boundary of the obscuration stop, which corresponds to the light-determining edge 220, can be designed to be circular, elliptical, polygonal, for example rectangular or square, or correspond to a free form.

The projection system 104 also comprises a frame-shaped holder 216 holding the obscuration stop 214 in the beam path 200. The holder 216 in the example shown is attached to a stop module 228 of the projection system 104, more specifically to a side wall of the stop module 228. It is also possible that the holder 216 itself forms part of the stop module 228 or that the holder 216 is embodied in the form of a carrying frame of the projection system 104 that is being used for holding the mirrors M1 to M6. The holding of the mirrors M1 to M6 can for example be realized via actuators (for example gravity compensators and/or Lorentz actuators). As an alternative to the example shown in FIG. 2A, the aperture stop 202 itself can be used as a holder for the obscuration stop 214.

Figure 2B:
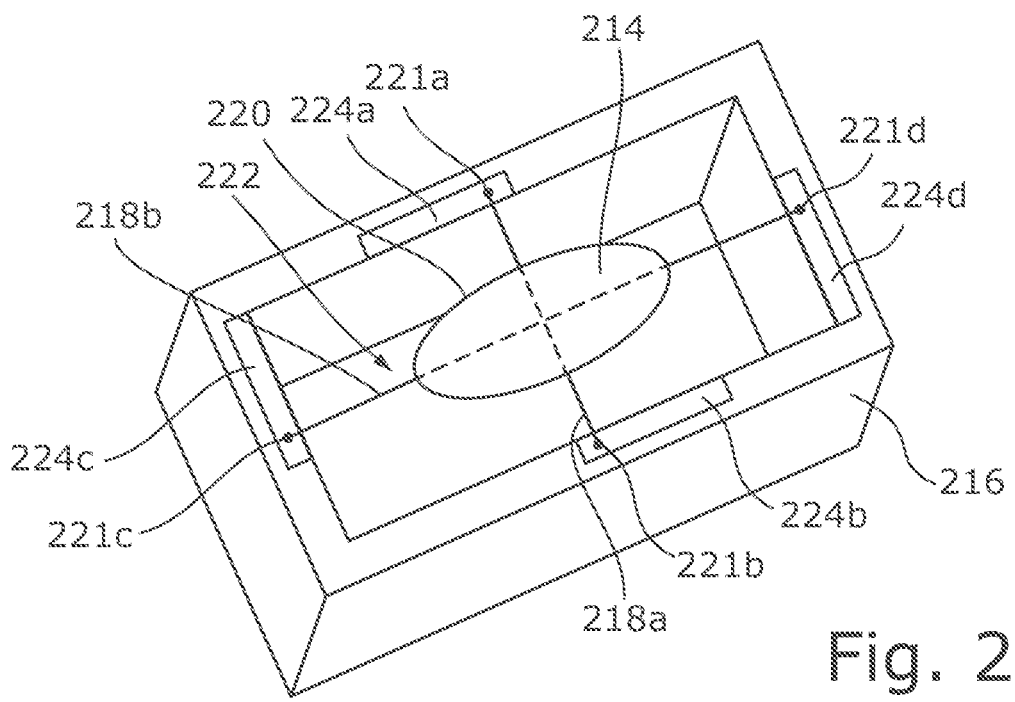

The obscuration stop 214 in the example shown is connected to the holder 216 via two wire-shaped webs 218a,b, as is seen in FIG. 2B. It goes without saying that the obscuration stop 214 can also be connected to the holder 216 via more than two wire-shaped webs 218a,b. The two wire-shaped webs 218a,b span an opening 222 in the frame-shaped holder 216, that is to say a respective web 218a,b, which proceeds from one side of the frame-shaped holder 216, does not terminate at the obscuration stop 214 but rather extends up to an opposite side of the frame-shaped holder 216. In the example shown in FIG. 2B, the two wire-shaped webs 218a,b, which span the opening 222, are aligned perpendicular to one another, although this is not absolutely necessary.

For thermally decoupling the thermal expansion of the obscuration stop 214 from the holder 216, the projection system 104 in the example shown has four spring elements in the form of leaf springs 224a-d, which are arranged between a respective end of a wire-shaped web 218a,b and the frame-shaped holder 216. In the example shown in FIG. 2B, the leaf springs 224a-d are mounted on a respective inner side of the frame-shaped holder 216. The leaf springs 224a-d are pretensioned, that is to say they pretension the two wire-shaped webs 218a,b. For details of the pretensioning with the aid of springs, reference is made once again to DE 10 2017 219 266 A1, which was mentioned in the introductory part.

As can likewise be seen in FIG. 2B, the wire-shaped webs 218a,b are not connected directly to the leaf springs 224a-d but via length-setting elements 221a-d (shown highly schematically), which allow the setting of the length of a respective wire-shaped web 218a,b. In the example shown, the length-setting elements 221a-d have coil-shaped (cylindrical) winding elements to which a respective end of one of the webs 218a,b is attached. The winding elements can be rotated about their longitudinal axes until the respective wire-shaped web 218a,b has its desired length or tension. After tensioning, the winding elements can be fixed in a desired angular position. They can be fixed using a fixing element for example in the form of a clamping element, which clamps the winding element between two clamping jaws. The clamping of the winding element is released only when the wire-shaped web 218a,b needs to be tensioned (again).

A respective length-setting device 221a-d is mounted on the pretensioned leaf spring 224a-d and is deflected together with the latter. In this way, the pretensioning of the wire-shaped webs 218a,b is maintained even if the length of a respective wire-shaped web 218a,b inadvertently increases, for example because the material of the web 218a,b exceeds the yield limit or because the web 218a,b heats up.

As was described further above, the aperture stop 202 and the obscuration stop 214 are accommodated in a common stop module 228, which itself is part of a vacuum housing (not depicted) surrounding or encapsulating the (vacuum) environment of the second mirror M2 (cf. FIG. 1A). The stop module 228 is mounted on the upper side of a vacuum housing 226 (illustrated in FIG. 2A), which surrounds or encapsulates the first mirror M1.

The obscuration stop 214 shown in FIG. 2A-2B is releasably connected to the webs 218a,b. Due to the releasable connection of the obscuration stop 214 to the webs 218a,b, the adjustment thereof is simplified and interchanging the obscuration stop 214 is made simpler. There are various possibilities for releasably connecting the plate-shaped obscuration stop 214 to the webs 218a,b, of which several possibilities will be described in more detail below.

Figure 3A:
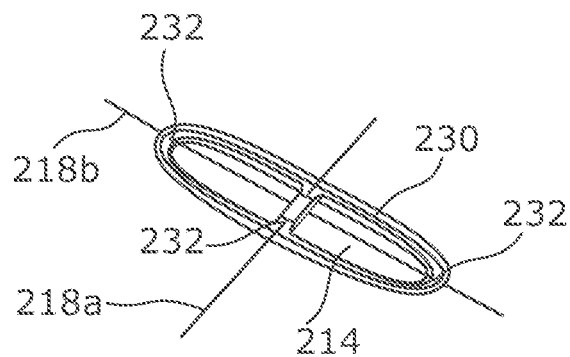
FIGS. 3A-3C show schematic illustrations of the obscuration stop of FIG. 2A-2B, in which the wire-shaped webs are releasably connected to a carrying structure of the obscuration stop.
Figure 3B:
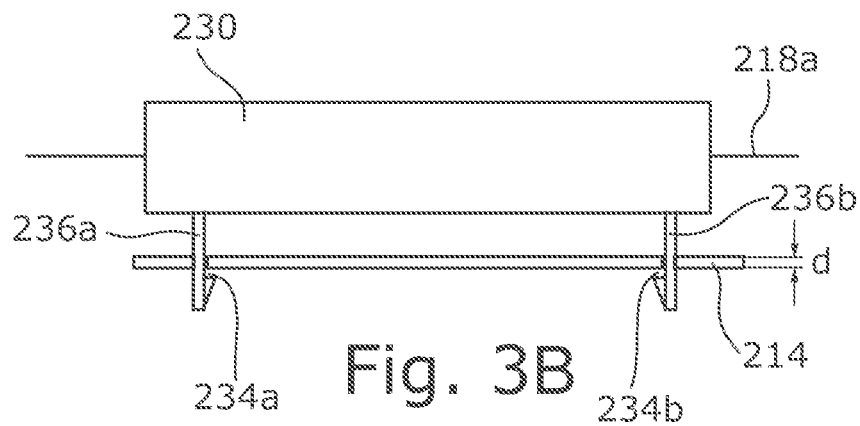
Figure 3C:
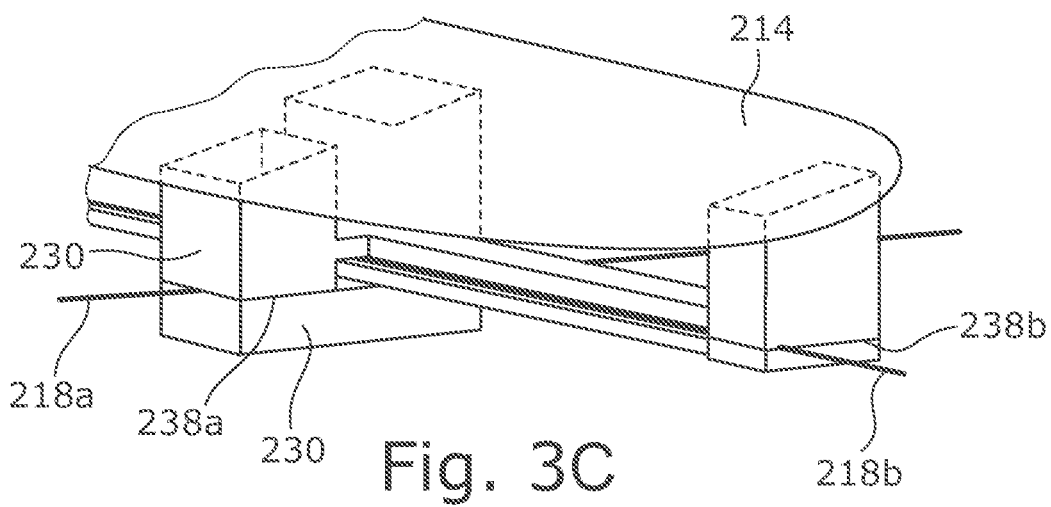

In the example illustrated in FIGS. 3A-3C, the obscuration stop 214 is designed to be very thin and has a thickness d of typically less than approximately 500 μm, for example in the order of 200 μm to 300 μm. The plate-shaped obscuration stop 214 in the example shown is designed as a quartz glass plate, which is produced by chemical etching and has a reflective coating. Alternatively, the obscuration stop 214 can also be formed as a thin metal sheet, for example made from invar.

In the example shown in FIGS. 3A-3B, the thin, plate-shaped obscuration stop 214 is attached to or held at a frame-shaped carrying structure 230 (adapter). As can be seen in FIG. 3A, the webs 218a,b are guided through through-holes 232 in the carrying structure 230 in order to releasably connect the carrying structure 230 to the webs 218a,b and to keep it in position. The obscuration stop 214 in the example shown in FIGS. 3A,b is suspended at the frame-shaped carrying structure 230. For this purpose, openings 234a,b have been made in the obscuration stop 214, as can be seen in the sectional illustration of FIG. 3B. Hook-shaped retaining elements 236a,b of the frame-shaped carrying structure 230, on which the obscuration stop 214 is suspended and held in its position, are guided through the openings 234a,b. The hook-shaped retaining elements 236a,b can form a reflexed profile in the material (e.g. invar) of the carrying structure 230. In this case, the retaining elements 236a,b are initially guided through the openings 234a,b in the obscuration stop 214 and then bent over to produce the hook-shaped or S-shaped geometry shown in FIG. 3B.

In the example shown in FIG. 3C, the carrying structure 230 forms a support structure for the plate-shaped obscuration stop 214, which is designed as described in FIGS. 3A-3B. The obscuration stop 214 in this case is attached to the upper side of the carrying structure 230 for example via an integral connection. In the example shown in FIG. 3C, the wire-shaped webs 218a,b are received in indent-shaped depressions 238a,b of the carrying structure 230, into which the wire-shaped webs 218a,b are (releasably) clamped.

As is likewise clear in FIGS. 3A-3C, the carrying structure 230 does not laterally project beyond the obscuration stop 214 so as not to obstruct its function of blocking out the inner partial region 200b of the beam path 200.

Figure 4A:
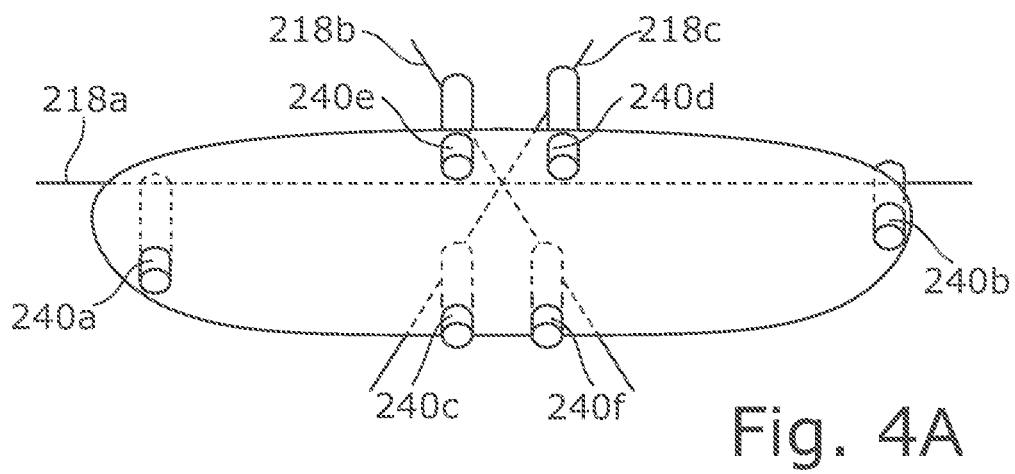
FIGS. 4A-4B show schematic illustrations of an obscuration stop having holder elements with notches, to which the wire-shaped webs are connected by clamping.
Figure 4B:
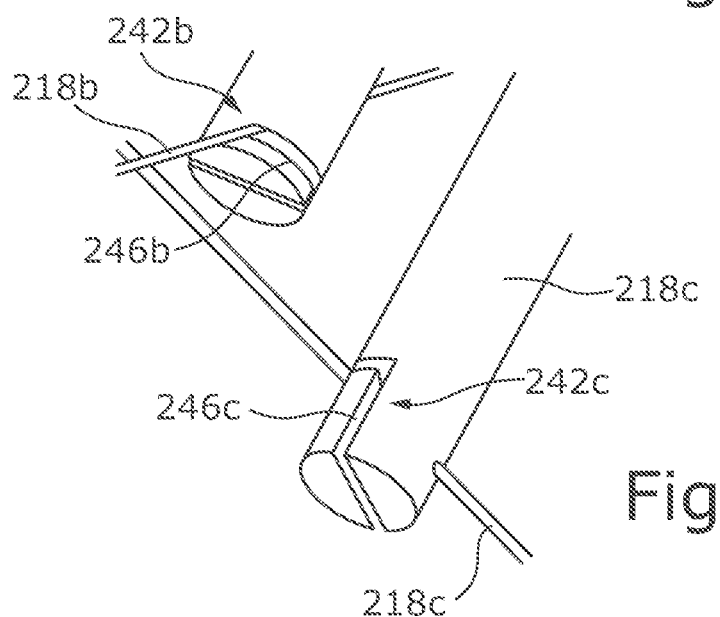

FIGS. 4A-4B show an example of the plate-shaped obscuration stop 214, which is held with the aid of six rod-shaped retaining elements 240a-f (pins) at three wire-shaped webs 218a-c. Each of the three webs 218a-c is releasably connected in each case to two of the six rod-shaped retaining elements 240a,b; 240c,d; 240e,f. A respective rod-shaped retaining element 240a-f in the example shown is pressed together with the material of the obscuration stop 214, but can also be attached to the obscuration stop 214 in another way or may be formed in one piece with the obscuration stop 214.

The rod-shaped retaining elements 240a-f project perpendicularly outwards from the plane of the plate-shaped obscuration stop 214 and have, outside the plane of the obscuration stop 214, a respective retaining section 242d, 242e for the releasable connection to a respective wire-shaped web 218b, 218c, as is illustrated in FIGS. 4A-4B for the fourth and fifth rod-shaped retaining elements 240d, 240e. In the example shown in FIGS. 4A-4B, the respective retaining section 242d, 242e has an angled notch 246d, 246e to produce a clamping connection with the associated wire-shaped web 218b, 218c. When the releasable connection is established, the wire-shaped web 218b, 218c is introduced into the angled notch 246d, 246e, which is designed such that the wire-shaped web 218b, 218c and the obscuration stop 214 block themselves. As can be seen in FIG. 4A, in each case two of the retaining elements 240a,b; 240c,d; 240e,f, which are provided for the connection to the same web 218a-c, are arranged at diametrically opposite sides in the region of the outer periphery of the obscuration stop 214.

Figure 5:
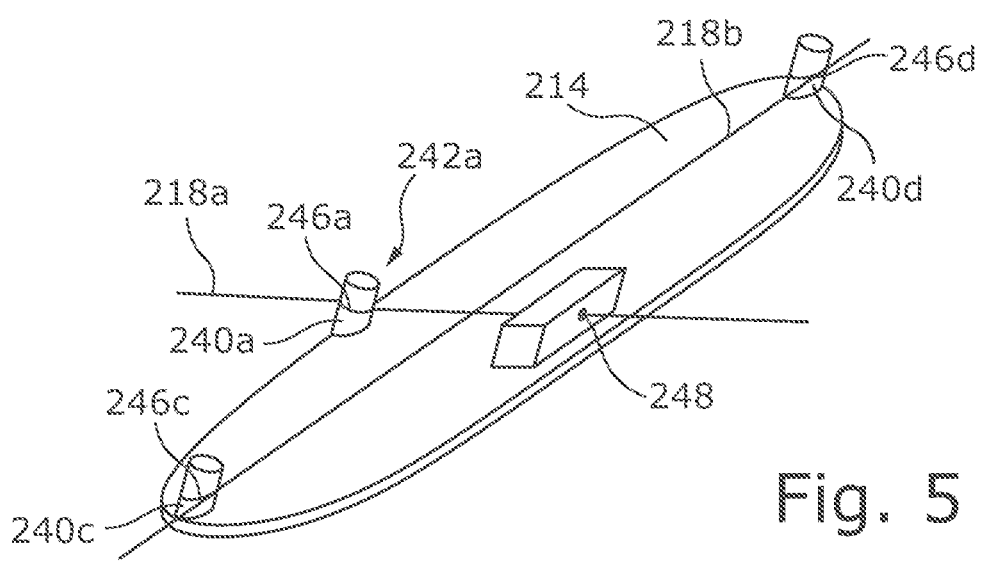
FIG. 5 shows a schematic illustration of an obscuration stop, which has a holder element having a notch for being wrapped with a wire-shaped web and a hole for guiding the wire-shaped web.

FIG. 5 shows an obscuration stop 214 that has a rod-shaped retaining element 240a projecting beyond the plane of the obscuration stop 214. The retaining element 240a has a retaining section 242a for the releasable connection to a wire-shaped web 218a.

In the retaining section 242a, at the outer circumference of the rod-shaped retaining element 240a, an annually circumferential notch 246a is formed, around which the wire-shaped web 218a is wound. A hole 248 through which the wire-shaped web 218a is guided is used to align the obscuration stop 214 or block the orientation of the wire-shaped web 218a. In the example shown in FIG. 5, the hole 248 extends substantially radially outwards and is formed in a protrusion on a side of the obscuration stop 214 that is diametrically opposite the retaining element 240a. It goes without saying that, as an alternative to the guidance through the hole 248, the wire-shaped web 218a can also be wound around a further rod-shaped retaining element so as to fix the orientation thereof. FIG. 5 shows this by way of example for a second wire-shaped web 218b, which is wound around a respective annually circumferential notch 246c, 246d in two further rod-shaped retaining elements 240c, 240d, which lie diametrically opposite one another. It is likewise to be understood that at least one further wire-shaped web can be connected to the obscuration stop 214 in a similar manner to fix the position thereof in the beam path 200. In place of the guidance through the hole 248, the wire-shaped web 218a may also be guided through a depression in the plate-shaped obscuration stop 214, for example in the form of an indent or the like.

Figure 6A:
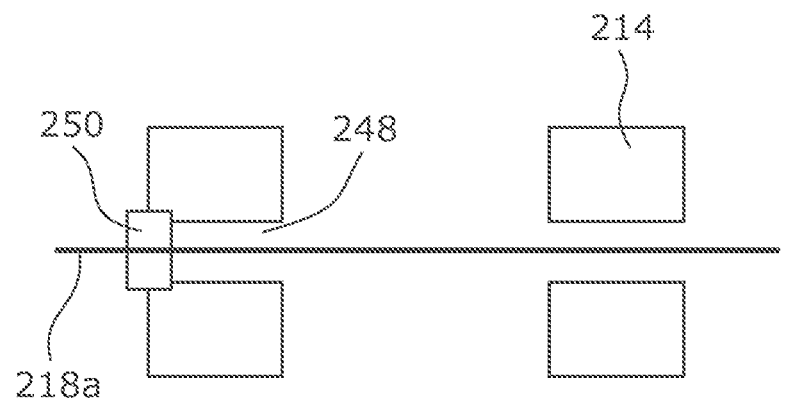
FIGS. 6A-6B show schematic sectional illustrations of two obscuration stops having one and two holes, respectively, through which a wire-shaped web is guided.

FIG. 6A shows a sectional illustration of an obscuration stop 214, which has a central opening, as in FIG. 5. A penetrating hole 248, which, as in FIG. 5, is aligned parallel to the plane along which the plate-shaped obscuration stop 214 extends, is formed in the obscuration stop 214. A wire-shaped web 218a is guided through the hole 248. As can be seen in FIG. 6A, the hole 248 has a significantly larger diameter than the wire-shaped web 218a. To fix the location or the orientation of the wire-shaped web 218a relative to the hole 248, the wire-shaped web 218a is embedded in a seal 250, which closes the hole 248 at one end. The seal 250 is releasably connected to the hole 248, so that the wire-shaped web 218a can be released from the obscuration stop 214. As can likewise be seen in FIG. 6A, the wire-shaped web 218a is guided at the other end of the obscuration stop 214 through the hole 248 without being fixed in the hole 248 by a further seal. It goes without saying that such additional fixing is likewise possible.

Figure 6B:
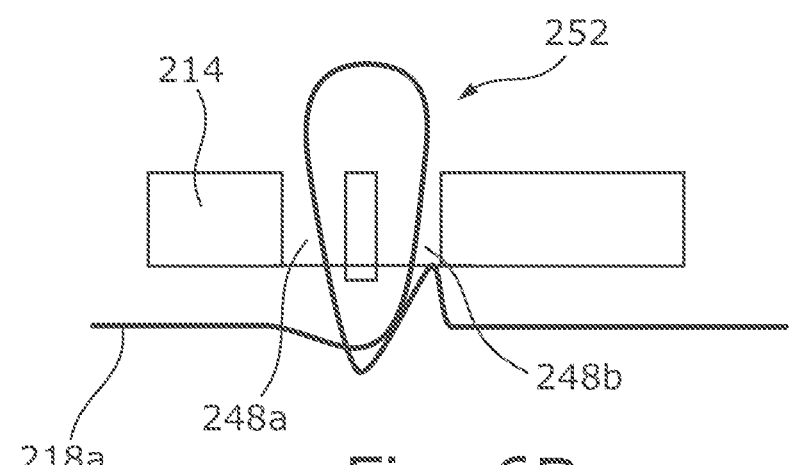

FIG. 6B shows an example of an obscuration stop 214, which has two parallel holes 248a,b, which extend perpendicular to the plate plane of the obscuration stop 214 and are arranged at a comparatively small distance from one another. The wire-shaped web 218a in this case is guided through the two adjacent holes 248a,b and is wound around a section of the obscuration stop 214 located between the two holes 248a,b in the manner of a loop 252 in order to be releasably connected in this way to the obscuration stop 214. In the manner shown in FIGS. 6A-6B, the obscuration stop 214 can also be held in the desired position and alignment.

Figure 7A:
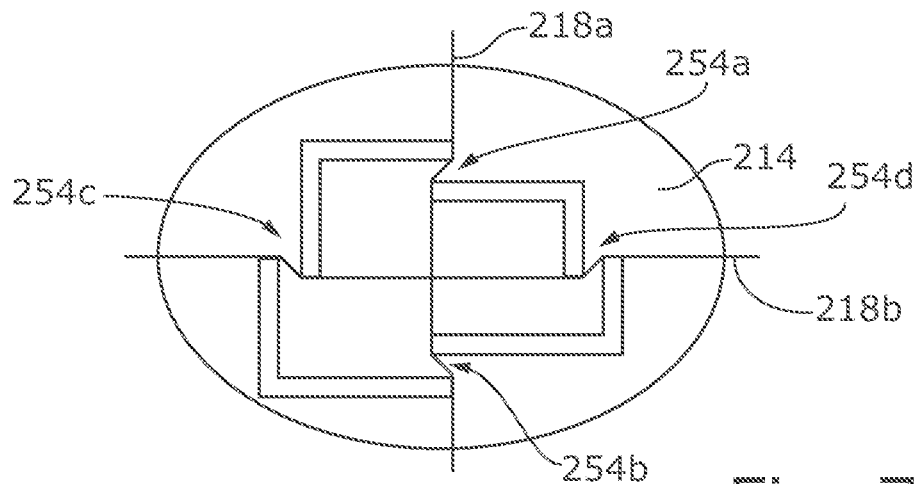
FIGS. 7A-7C show schematic illustrations of an obscuration stop having depressions with a curved section with an S-shaped geometry for bending the wire-shaped webs.
Figure 7B:
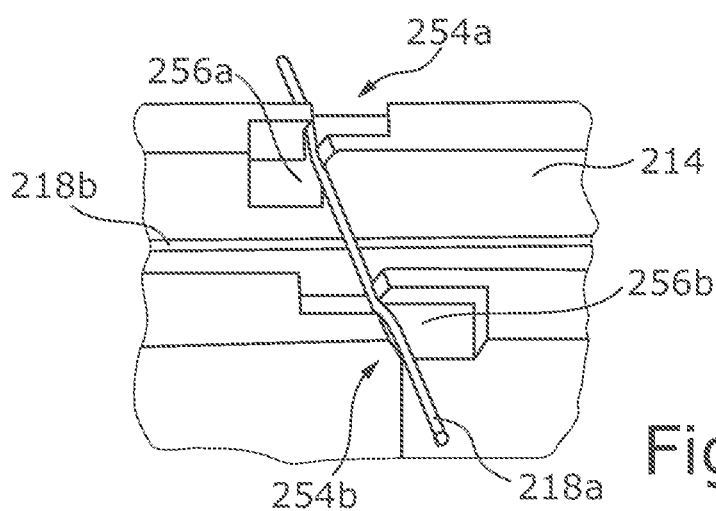
Figure 7C:
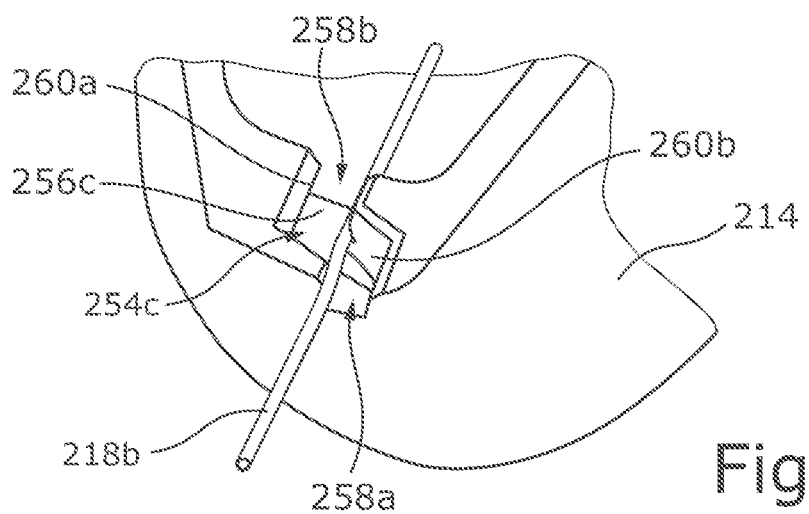

FIGS. 7A-7C show an obscuration stop 214, which has, at its side facing away from the incident EUV radiation 100A, a frame-shaped structure that projects over a plate-shaped region, in which structure four depressions 254a-d are formed. The frame-shaped structure and the plate-shaped region of the obscuration stop 214 are formed in one piece in the example shown.

The first wire-shaped web 218a is guided in a first and second depression 254a,b, which are mounted at diametrically opposite positions along the frame-shaped structure.

Correspondingly, the second wire-shaped web 254c,d is guided in a third and fourth depression 254c,d, which are likewise mounted at diametrically opposite positions along the frame-shaped structure of the obscuration stop 214.

As can be seen in FIGS. 7B-7C, the depressions 254a-d each have a curved section 256a-d, which is used to slightly bend the respective wire-shaped web 218a,b and in this way to retain it at the obscuration stop 214 due to friction or bracing. Fixing is understood to mean that the obscuration stop 214 cannot be easily displaced along the wire-shaped web 218a,b due to the bracing and/or friction. The bending shown in FIGS. 7B-7C is particularly beneficial if the respective wire-shaped web 218a,b is pretensioned, as is shown in FIG. 2A, because the pretensioning promotes the fixing and the retaining of the obscuration stop 214 in the desired position and alignment.

As can be seen in FIG. 7C, the curved section 256c is formed between an entry-side end 258a of the depression 254c and an exit-side end 258b of the depression 254c and in the example shown has an S-shaped geometry. In the example shown, the wire-shaped web 218a enters the depression 254c at the entry-side end 258a and emerges at the exit-side end 258b of the depression 254c with a parallel offset brought about by the section 256c of the depression 254c that has an S-shaped curvature.

As can likewise be seen in FIGS. 7A-7C, the width of the respective depression 254a-d is significantly larger than the width of the respective wire-shaped web 218a,b, which is guided through the depression 254a-d. The bending of the respective web 218a,b is realized in this case by the wire-shaped web 218a,b being guided at the entry-side end 258a of the depression 254c along a side wall 260a, which is on the left in the example shown, and at the exit-side end 258b at a side wall 260b of the depression 254c that is on the right in the example shown, wherein the right side wall 260b of the depression 254c is positioned slightly further to the left after the section 256c that has an S-shaped curvature than the left side wall 260a of the depression 254c before the section 256c that has an S-shaped curvature. In this way, a slight lateral offset of the wire-shaped web 218b is produced as it passes through the depression 254c, which brings about the bending.

As can be seen in FIGS. 7B-7C, the side wall 260a, 260b has, in a respective section at which the side wall is used to guide the wire-shaped web 218a,b, a V-shaped indent having a section that projects over the indent and engages over a respective wire-shaped web 218a,b. The depressions 254a-d therefore also make it possible to retain or suspend the obscuration stop 214 in the beam path 200. In place of the depressions 254a-d, it is also possible to use holes or depressions having a lid for retaining or suspending the obscuration stop 214 in the beam path 200.

In place of the wire-shaped webs 218a-c described further above, it is also possible for different types of wire-shaped components to be releasably connected to the obscuration stop 214, for example webs in the form of thin blades, threads or springs. However, webs 218a-c in the form of wires have proven good for example for bringing about the pretensioning. It goes without saying that, rather than the obscuration stop 214, other components can be releasably attached to a holder 216 in the manner described above, for example other types of stops, for example the aperture stop 202 illustrated in FIG. 2A, a stray-light stop, etc. Other components than stop elements, for example actuators or the like, can also be releasably held at webs in the manner described above.

What is claimed is:

1. An optical system, comprising:
a plate-shaped component;
a frame-shape holder holding the plate-shaped component;
a plurality of webs connecting the plate-shaped component and the frame-shaped holder; and
a carrying structure, wherein the plate-shaped component is releasably connected to the webs,
the plate-shaped component is attached to the carrying structure, the webs are releasably connected to the carrying structure;
a length-setting device configured to set a length a web, and the optical system is a lithography optical system.

2. The optical system of claim 1, wherein the plate-shaped element comprises a stop element.

3. The optical system of claim 2, wherein the webs comprise wire-shaped webs.

4. The optical system of claim 1, wherein the webs comprise wire-shaped webs.

5. The optical system of claim 1, wherein at least one web spans an opening in the frame-shaped holder.

6. The optical system of claim 1, further comprising a spring between a web and the holder.

7. The optical system of claim 6, wherein the spring comprises a pretensioned spring.

8. The optical system of claim 1, wherein the carrying structure does not project laterally beyond the plate-shaped component.

9. The optical system of claim 1, wherein the plate-shaped component comprises a retaining element comprising a retaining section configured to releasably connect to a web.

10. The optical system of claim 9, wherein the retaining section comprises a notch configured to clamp to a web.

11. The optical system of claim 9, wherein the retaining section defines a notch wrapped with a web.

12. The optical system of claim 1, wherein the plate-shaped component comprises a member selected from the group consisting of a depression and a hole, and a web extends through the member.

13. The optical system of claim 12, further comprising a seal closing the hole, wherein the seal surrounds the web and fixes the web in the hole.

14. The optical system of claim 12, wherein the member comprises a curved section configured to bend the web to fix the web to the plate-shaped component.

15. The optical system of claim 14, wherein the curved section has an S-shaped geometry.

16. The optical system of claim 1, wherein:
the plate-shaped component comprises two holes;
a web extends from the two holes; and
between the two holes, the wire-shaped web is wound around the component in the manner of a loop.

17. The optical system of claim 1, wherein the plate-shaped element is an obscuration stop configured to block an inner partial region of a beam path of the optical system.

18. The optical system of claim 1, wherein the plate-shaped component comprises a metallic material.

19. The optical system of claim 1, further comprising:
a projection system configured to image a photomask onto a wafer,
wherein the plate-shaped element is a region of a pupil plane of the projection system.

* * * * *

UNITED STATES PATENT AND TRADEMARK OFFICE
CERTIFICATE OF CORRECTION

| | | |
|---|---|---|
| PATENT NO. | : 12,422,756 B2 | Page 1 of 1 |
| APPLICATION NO. | : 18/173461 | |
| DATED | : September 23, 2025 | |
| INVENTOR(S) | : Tanja Mueller, Rudi Littelink and Johannes Bauer | |

It is certified that error appears in the above-identified patent and that said Letters Patent is hereby corrected as shown below:

In the Specification

Column 7, Line 18, delete "FIG." and insert -- FIGS. --.

Column 10, Line 51, delete "FIG." and insert -- FIGS. --.

Column 11, Line 8, delete "FIGS. 3A,b" and insert -- FIGS. 3A-B --.

In the Claims

Column 14, Line 4, in Claim 1, delete "frame-shape" and insert -- frame-shaped --.

Column 14, Line 13, in Claim 1, delete "a web," and insert -- of a web, --.

Column 14, Line 27, in Claim 7, delete "pretensioned" and insert -- pre-tensioned --.

Signed and Sealed this
Eleventh Day of November, 2025

John A. Squires
*Director of the United States Patent and Trademark Office*